United States Patent [19]

Kervin et al.

[11] Patent Number: 4,606,115

[45] Date of Patent: Aug. 19, 1986

[54] METHOD OF MANUFACTURING OPTICALLY SENSITIVE SEMICONDUCTOR DEVICES INCLUDING ANTI-REFLECTIVE COATINGS

[75] Inventors: Douglas J. Kervin, Mesa; Carl E. Derrington, Tempe, both of Ariz.

[73] Assignee: Motorola, Inc., Schaumburg, Ill.

[21] Appl. No.: 733,550

[22] Filed: May 14, 1985

[51] Int. Cl.[4] .................. H01L 27/14; H01L 27/78
[52] U.S. Cl. .................. 29/572; 29/577 C; 357/30
[58] Field of Search ............... 29/572, 577 C; 357/30, 357/52; 427/94, 74; 136/254

[56] References Cited

U.S. PATENT DOCUMENTS 4,155,094  5/1979  Ohba ........................... 357/30

FOREIGN PATENT DOCUMENTS

| 88381 | 7/1981 | Japan | 29/572 |
| 138964 | 10/1981 | Japan | 29/572 |
| 138965 | 10/1981 | Japan | 29/572 |
| 79680 | 5/1982 | Japan | 29/572 |

*Primary Examiner*—Brian E. Hearn
*Assistant Examiner*—John T. Callahan
*Attorney, Agent, or Firm*—Jonathan P. Meyer

[57] ABSTRACT

A method of manufacturing optically sensitive semiconductor devices in which an anti-reflective coating is provided without the addition of mask or etch steps to the manufacturing process flow. A single layer of silicon nitride is patterned to provide an anti-reflective coating over the active area of the optically sensitive device and to form the dielectric of any capacitors also a part of the integrated circuit. An oxide passivation layer is used so that it may be opened over the active area without disturbing the anti-reflective coating.

4 Claims, 3 Drawing Figures

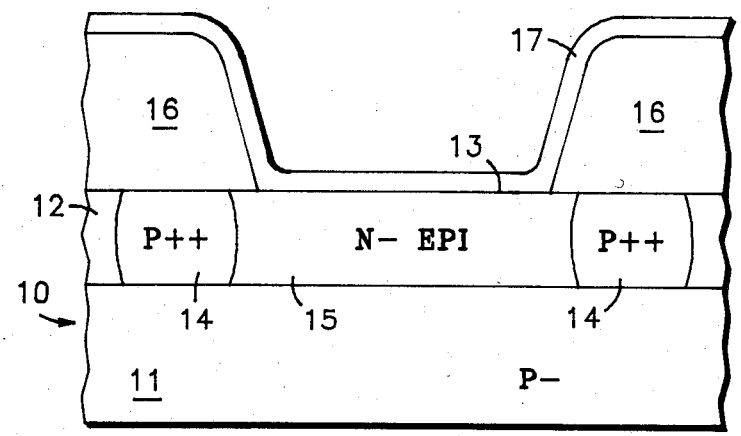
FIG. 1 -PRIOR ART-
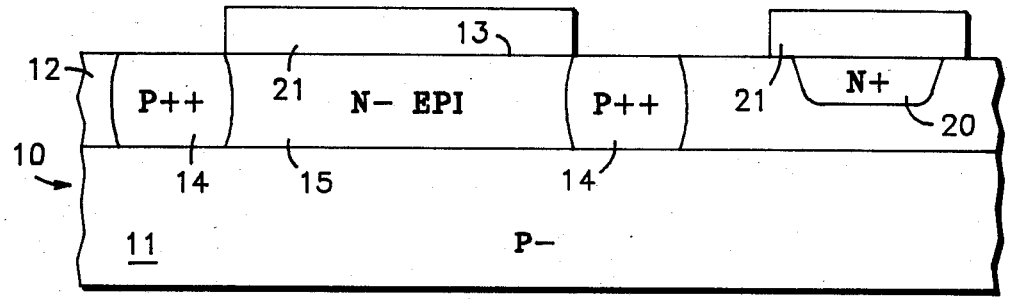
FIG. 2A
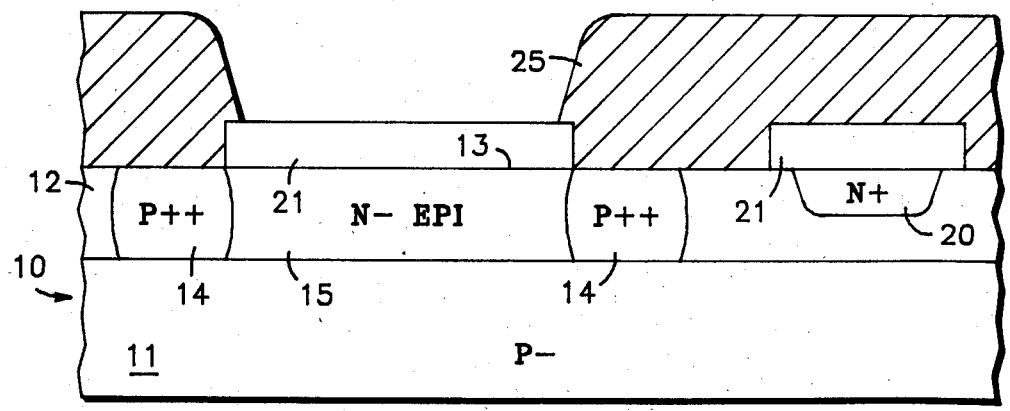
FIG. 2B

METHOD OF MANUFACTURING OPTICALLY SENSITIVE SEMICONDUCTOR DEVICES INCLUDING ANTI-REFLECTIVE COATINGS

FIELD OF THE INVENTION

The present invention relates, in general, to anti-reflective coatings useful for increasing the efficiency of optically sensitive semiconductor devices. More particularly, the invention relates to a method of manufacturing anti-reflective coatings over the optically active portions of an integrated circuit which has a minimal impact on the process for manufacturing the integrated circuit.

BACKGROUND OF THE INVENTION

The use of single layer anti-reflective coatings to decrease the reflectance of the interface between two propagation media is well known. A coating which satisfies a well-known equation involving the indices of refraction of the coating, the substrate and the overlying medium, the wavelength of the energy and the thickness of the coating is typically used to minimize the reflectance of the interface.

In the field of optically sensitive semiconductor devices such anti-reflective coatings have been widely applied to photovoltaic cells and other discrete devices. A common coating used for this purpose is silicon nitride ($Si_3N_4$). This material is attractive because it is readily available and because it has an index of refraction lower than that of silicon.

Currently, integrated circuits in which an optically sensitive device is combined with a number of other circuit elements are becoming increasingly important. In order to apply an anti-reflective coating to the optically sensitive device in such circuits, it is necessary to add extra mask and process steps near the end of the manufacturing process flow in order to remove thick overlying passivation layers and then to apply the anti-reflective coating. In most cases, the added cost of these extra steps is not recoverable due to the relatively low margins available on these integrated circuits. Therefore, no anti-reflective coating is commonly applied to such devices.

SUMMARY OF THE INVENTION

Accordingly, it is an object of the present invention to provide an improved method for manufacturing optically sensitive semiconductor devices including anti-reflective coatings.

It is a further object of the present invention to provide a method of manufacturing anti-reflective coatings on the optically sensitive devices in integrated circuits which method does not require additional masking or process steps in the manufacturing process flow.

These and other objects and advantages of the present invention are provided by forming an optically sensitive semiconductor device having an active area, said active area having a face which comprises a portion of a first major surface of a body of semiconductor material; forming a first electrode of a capacitor on said first major surface of said body of semiconductor material; depositing a layer of silicon nitride overlying said first major surface of said body of semiconductor material; patterning said layer of silicon nitride to leave said active area and said first electrode covered by said layer of silicon nitride; depositing a passivation layer overlying said first major surface and said layer of silicon nitride; and opening said passivation layer overlying said active area.

These and other objects and advantages of the present invention will be apparent to one skilled in the art from the detailed description below taken together with the drawings.

BRIEF DESCRIPTION OF THE DRAWINGS

FIG. 1 is a cross-sectional view illustrating a prior art anti-reflective coating overlying an optically sensitive semiconductor device;

FIG. 2A is a cross-sectional view illustrating an intermediate stage in the manufacture of a semiconductor device including an anti-reflective coating according to the principles of present invention; and FIG. 2B is a cross-sectional view illustrating a subsequent intermediate stage in the manufacture of a semiconductor device including an anti-reflective coating according to the principles of the present invention.

DETAILED DESCRIPTION OF THE INVENTION

FIG. 1 is a cross-sectional view illustrating an optically sensitive semiconductor device and anti-reflective coating thereon which are typical of the prior art. A body of semiconductor material 10 comprises a substrate of 11 P-type material and an overlying epitaxial layer 12 of N-type material. The upper surface 13 of epitaxial layer 12 forms a first major surface of body 10 of semiconductor material. A P-type diffusion 14 extends from upper surface 13 of epitaxial layer 12 to substrate 11. Active region 15 of the optically sensitive semiconductor device comprises that portion of epitaxial layer 12 which is surrounded by P-type diffusion 14. In plan view, diffusion 14 is typically a circle.

The operation of an optically sensitive semiconductor device such as is shown in FIG. 1 is well known in the art. Photons having an energy equal to or greater than the band gap of the N-type epitaxial material may be absorbed within active region 15 to produce an electron-hole pair. The charge carriers may then be swept across an appropriately biased PN junction to produce a current in a circuit external to the optically sensitive device. Obviously, the current available from such a device is directly dependent on the number of photons which can be absorbed within the active area. As is apparent, it becomes critical to decrease the reflectance of the interface at upper surface 13 of the device.

As is typical of integrated circuits, the device shown in FIG. 1 includes a passivation layer 16 overlying nearly the entire circuit. Commonly, passivation layer 16 is a relatively thick layer of silicon nitride or an oxide. Passivation layer 16 is normally applied as the last, or nearly the last, step in the process flow with which the device is manufactured. Passivation layer 16 is normally many times too thick to be an effective anti-reflective coating.

In order to add an anti-reflective coating to a device such as is illustrated in FIG. 1 it is necessary to add several additional steps to the manufacturing process flow. First, it is necessary to open passivation layer 16 in the area overlying active area 15. This requires an additional mask and an additional etch step. Next, an anti-reflective coating 17 is applied overlying the entire circuit. Finally, it may be necessary to open anti-reflective coating 17 over the bonding pads with which contact is made to the integrated circuit.

As is apparent from the above description, the addition of an anti-reflective coating to an optically sensitive semiconductor device using typical prior art methods requires the addition of several steps to the process flow. This added cost may not be recoverable within the relatively small margins which are common on such parts.

FIGS. 2A and 2B illustrate intermediate steps in a method of manufacturing an optically sensitive semiconductor device including an anti-reflective coating according to the principles of the present invention. The method described is applicable to any integrated circuit which includes an optically sensitive device and one or more capacitors. A central feature of the present invention is the use of a single layer of silicon nitride, appropriately patterned, to form both the dielectric of any capacitors on the circuit and an anti-reflective coating overlying the active area of the optically sensitive device. As will be described in detail below, it is possible to add an anti-reflective coating to such a device without the addition of process or masking steps.

FIG. 2A illustrates an intermediate stage in the method according to the present invention. The device illustrated here is substantially identical to that described above. A body 10 of semiconductor material comprises a substrate 11 of P-type material and an epitaxial layer 12 of N-type material. A P-type diffusion 14 extends from upper surface 13 of epitaxial layer 12 to substrate 11. Diffusion 14 surrounds and defines an active region 15 of the optically sensitive device.

In the case in which the optically sensitive device is part of an integrated circuit which includes a number of other devices, it is almost always the case that at least one capacitor is a part of the integrated circuit. A first electrode 20 of such a capacitor is formed on upper surface 13 of epitaxial layer 12 by the diffusion of an N-type dopant. Alternatively, first electrode 20 may be formed by the deposition and patterning of a metal layer overlying upper surface 13 of epitaxial layer 12. In the method according to the present invention, a single layer of silicon nitride 21 is then deposited overlying the upper surface 13 of epitaxial layer 12. Silicon nitride layer 21 is then patterned to remove those portions not overlying active region 15 or first electrode 20. Since it would have been necessary to deposit and pattern a dielectric material overlying first electrode 20 in any case, this does not add process or mask steps to the process flow. It requires only that the mask used to pattern silicon nitride layer 21 be modified to leave silicon nitride overlying active area 15.

The choice of the thickness of silicon nitride layer 21 represents a trade off between the optimum thickness necessary to form an anti-reflective coating and the optimum thickness to form the dielectric of a capacitor. The capacitance of any capacitor is inversely proportional to the thickness of the dielectric. Therefore, it is desirable to make silicon nitride layer 21 as thin as possible consistent with the required breakdown voltage specification for the capacitor. On the other hand, in order that silicon nitride layer 21 be an effective anti-reflective coating it is necessary that its thickness be carefully chosen according to known criteria related to the indices of refraction of the substrate, the silicon and the media overlying the silicon nitride.

The most common method of forming a single layer anti-reflective coating is to make its thickness equal to an odd multiple of one quarter wave length. In this case, the square of the index of refraction of the anti-reflective coating material must equal the product of the indices of refraction of the substrate and the overlying media. In this case, the necessary degree of flexibility in choosing the index of refraction of the anti-reflective material is not present. Therefore, it is necessary to alter the thickness of the coating to achieve minimum reflection at the interface. The equation which describes the reflectance, R, of such an interface is:

$$R = \frac{(r_{01} + r_{12})^2 - 4 r_{01} r_{12} \sin^2(2\pi d_1 n_1/\lambda_o)}{(1 + r_{01} r_{12})^2 + 4 r_{01} r_{12} \sin^2(2\pi d_1 n_1/\lambda_o)}$$

$$\text{Where: } r_{ij} = \frac{n_i - n_j}{n_i + n_j};$$

$n_o$ = Index of refraction of epoxy;
$n_1$ = Index of refraction of $Si_3N_4$;
$n_2$ = Index of refraction of Si;
$d_1$ = Thickness of $Si_3N_4$; and
$\lambda_o$ = Wavelength.

Of course, this equation is dependent upon the wavelength of the energy, so the anti-reflective coating must be optimized for a certain band of wavelengths. The band of wavelengths most commonly of interest in integrated optically sensitive devices lies between 800 and 910 nanometers. By substitution into the above equation is is possible to calculate that a silicon nitride layer having a thickness in the range of 800 to 1400 Angstroms will provide an effective anti-reflective coating in this band of wavelengths. This assumes that the index of refraction of the encapsulating material is approximately 1.5, that the index of refraction of the silicon nitride is approximately 2 and that the index of refraction of the silicon is approximately 3.46.

Of course, the function which describes the reflectance of the interface with varying film thickness is periodic. This implies that some thicker film will also fall at a minima of this curve and provide an adequate anti-reflective coating. However, as described above it is desirable to minimize the thickness of the film to optimize performance of the capacitor.

In a particular embodiment of the present invention, silicon nitride layer 21 is chosen to be approximately 1250 Angstoms thick. This thickness serves as an effective anti-reflective coating and provides a capacitance per unit area of approximately 0.33 pf/mil².

FIG. 2B illustrates a subsequent stage in the method according to the present invention. A passivating layer 25 has been deposited overlying the entire integrated circuit. As is always the case, passivating layer 25 must be opened over the bonding pads (not shown) in order to make contact to the integrated circuit. Thus, appropriate patterning steps are always used after the deposition of passivating layer 25. By appropriate choice of the material for passivating layer 25 and of the etchant used to open the bonding pads, it is possible to open passivating layer 25 over active area 15 at the same time. In a particular embodiment of present invention passivating layer 25 is oxide. This may be etched using buffered HF so that silicon nitride layer 21 will not be affected. In some cases, it is desirable to add a Faraday shield overlying passivation layer 25. The Faraday shield material may be, for instance, indium oxide. The Faraday shield may be opened over the bonding pads using HCl, but is left in place over active area 15. The imposition of an indium oxide layer between silicon nitride layer 21 and the overlying epoxy does not alter the reflectance analysis substantially, since the index of refraction of indium oxide is roughly the same as that of epoxy. Of course, it is possible to recalculate the optimum thickness using the equation above.

While the present invention has been described with reference to a particular embodiment which includes a particular optically sensitive semiconductor device design, many other such device designs may be used with the present invention. The only requirement is that the overall circuit design be such that a single deposition step may be carried out to deposit silicon nitride over the surface of the active area and simultaneously form the dielectric of any capacitors on the circuit.

As will be apparent to those skilled in the art, the above-described method provides for the improved manufacturing of anti-reflective coatings on optically sensitive semiconductor devices. A method is provided by which such coatings may be applied to the optically sensitive devices in integrated circuits without the addition of mask or etch steps to the manufacturing process flow.

We claim:

1. A method of manufacturing an optically sensitive semiconductor device including an anti-reflective coating comprising the steps of:

forming an optically sensitive semiconductor device having an active area, said active area having a face which comprises a portion of a first major surface of a body of semiconductor material;

forming a first electrode of a capacitor on another portion of said first major surface of said body of semiconductor material;

depositing a layer of silicon nitride over all of said first major surface;

patterning said layer of silicon nitride to leave said active area and said first electrode covered by said layer of silicon nitride so said silicon nitride deposited on said active area acts as an antireflective layer and said silicon nitride deposited on said first electrode acts as a dielectric;

depositing a passivation layer overlying said first major surface and said layer of silicon nitride; and opening said passivation layer over said active area.

2. A method according to claim 1, wherein:

said passivation layer is an oxide layer.

3. A method according to claim 1 wherein:

said step of opening said passivation layer over said active area is carried out simultaneously with a step of opening said passivation layer over at least one bonding pad.

4. A method according to claim 1 wherein:

said silicon nitride is in the range of 800 to 1400 Angstroms thick.

* * * * *